(12) United States Patent
Sano et al.

(10) Patent No.: US 10,128,104 B2
(45) Date of Patent: Nov. 13, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Atsushi Sano, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/474,138

(22) Filed: Mar. 30, 2017

(65) Prior Publication Data
US 2017/0301539 A1  Oct. 19, 2017

(30) Foreign Application Priority Data

Apr. 15, 2016 (JP) .................................. 2016-082177

(51) Int. Cl.
*H01L 21/02* (2006.01)
*H01L 21/67* (2006.01)
(Continued)

(52) U.S. Cl.
CPC ........ *H01L 21/02271* (2013.01); *C23C 16/30* (2013.01); *C23C 16/36* (2013.01); *C23C 16/45531* (2013.01); *C23C 16/45546* (2013.01); *C23C 16/45563* (2013.01); *C23C 16/45578* (2013.01); *C23C 16/52* (2013.01); *H01L 21/0217* (2013.01); *H01L 21/02115* (2013.01);
(Continued)

(58) Field of Classification Search
CPC ......... H01L 21/02115; H01L 21/02126; H01L 21/02167; H01L 21/0217; H01L 21/02211; H01L 21/02216; H01L 21/02219; H01L 21/02252; H01L 21/02263; H01L 21/02271; H01L 21/02274; H01L 21/67005; H01L 21/67011; C23C 16/36; C23C 16/45531; C23C 16/52
See application file for complete search history.

(56) References Cited

U.S. PATENT DOCUMENTS 7,300,885 B2 * 11/2007 Hasebe .................. C23C 16/345
257/E21.269
2006/0032443 A1 * 2/2006 Hasebe .................... C23C 16/30
118/715
(Continued)

FOREIGN PATENT DOCUMENTS

JP  2013-030752 A  2/2013

*Primary Examiner* — Joseph C Nicely
(74) *Attorney, Agent, or Firm* — Volpe and Koenig, P.C.

(57) ABSTRACT

A method of manufacturing a semiconductor device includes forming a film on a substrate by overlapping the following during at least a certain period: (a) supplying a first source to the substrate, the first source including at least one of an inorganic source containing a specific element and a halogen element and an organic source containing the specific element and the halogen element; (b) supplying a second source to the substrate, the second source including at least one of amine, organic hydrazine, and hydrogen nitride; and (c) supplying a third source to the substrate, the third source including at least one of amine, organic hydrazine, hydrogen nitride, and organic borane.

9 Claims, 5 Drawing Sheets

(51) Int. Cl.
*C23C 16/36* (2006.01)
*C23C 16/455* (2006.01)
*C23C 16/52* (2006.01)
*C23C 16/30* (2006.01)

(52) U.S. Cl.
CPC .. H01L 21/02126 (2013.01); H01L 21/02167 (2013.01); H01L 21/02211 (2013.01); H01L 21/02216 (2013.01); H01L 21/02219 (2013.01); H01L 21/02252 (2013.01); H01L 21/02263 (2013.01); H01L 21/02274 (2013.01); H01L 21/67005 (2013.01); H01L 21/67011 (2013.01)

(56) References Cited

U.S. PATENT DOCUMENTS

| | | | | |
|---|---|---|---|---|
| 2006/0286817 | A1* | 12/2006 | Kato | C23C 16/345 438/791 |
| 2009/0181550 | A1* | 7/2009 | Hasebe | C23C 16/345 438/791 |
| 2012/0329286 | A1 | 12/2012 | Takeda et al. | |
| 2013/0102132 | A1* | 4/2013 | Takeda | C23C 16/325 438/478 |
| 2013/0149873 | A1* | 6/2013 | Hirose | H01L 21/31 438/763 |
| 2013/0237064 | A1* | 9/2013 | Kirikihira | H01L 21/67109 438/758 |
| 2013/0280921 | A1* | 10/2013 | Takeda | H01L 21/02115 438/781 |
| 2015/0228474 | A1* | 8/2015 | Hanashima | H01L 21/0228 438/778 |
| 2015/0357181 | A1* | 12/2015 | Yamamoto | H01L 21/0228 438/778 |
| 2016/0155627 | A1* | 6/2016 | Hanashima | H01L 21/0228 438/786 |
| 2016/0233085 | A1* | 8/2016 | Yamaguchi | H01L 21/02126 |
| 2016/0314962 | A1* | 10/2016 | Higashino | H01L 21/02274 |
| 2017/0011908 | A1* | 1/2017 | Matsuoka | C23C 16/45531 |
| 2017/0025271 | A1* | 1/2017 | Hashimoto | H01L 21/02362 |
| 2017/0040157 | A1* | 2/2017 | Hashimoto | H01L 21/0228 |
| 2017/0263439 | A1* | 9/2017 | Hashimoto | C23C 16/45527 |

* cited by examiner

METHOD OF MANUFACTURING SEMICONDUCTOR DEVICE, SUBSTRATE PROCESSING APPARATUS, AND RECORDING MEDIUM

BACKGROUND

Technical Field

This present disclosure relates to a method of manufacturing a semiconductor substrate, a substrate processing apparatus, and a non-transitory computer-readable recording medium.

Related Art

As one of the processes of manufacturing a semiconductor device, a process of forming a film on a substrate is performed.

SUMMARY

This present disclosure provides a technology that is capable of achieving a reduction in a deposition temperature.

According to one aspect of this present disclosure, there is provided a method of manufacturing a semiconductor device including forming a film on a substrate by overlapping the following during at least a certain period:

(a) supplying a first source to the substrate, the first source including at least one of an inorganic source containing a specific element and a halogen element and an organic source containing the specific element and the halogen element;

(b) supplying a second source to the substrate, the second source including at least one of amine, organic hydrazine, and hydrogen nitride; and (c) supplying a third source to the substrate, the third source including at least one of amine, organic hydrazine, hydrogen nitride, and organic borane.

According to this present disclosure, is possible to achieve a reduction in a deposition temperature.

DETAILED DESCRIPTION

Embodiment of this Present Disclosure

Hereinafter, an embodiment of this present disclosure will be described with reference to FIGS. 1 to 3.

(1) CONFIGURATION OF SUBSTRATE PROCESSING APPARATUS

Figure 1:
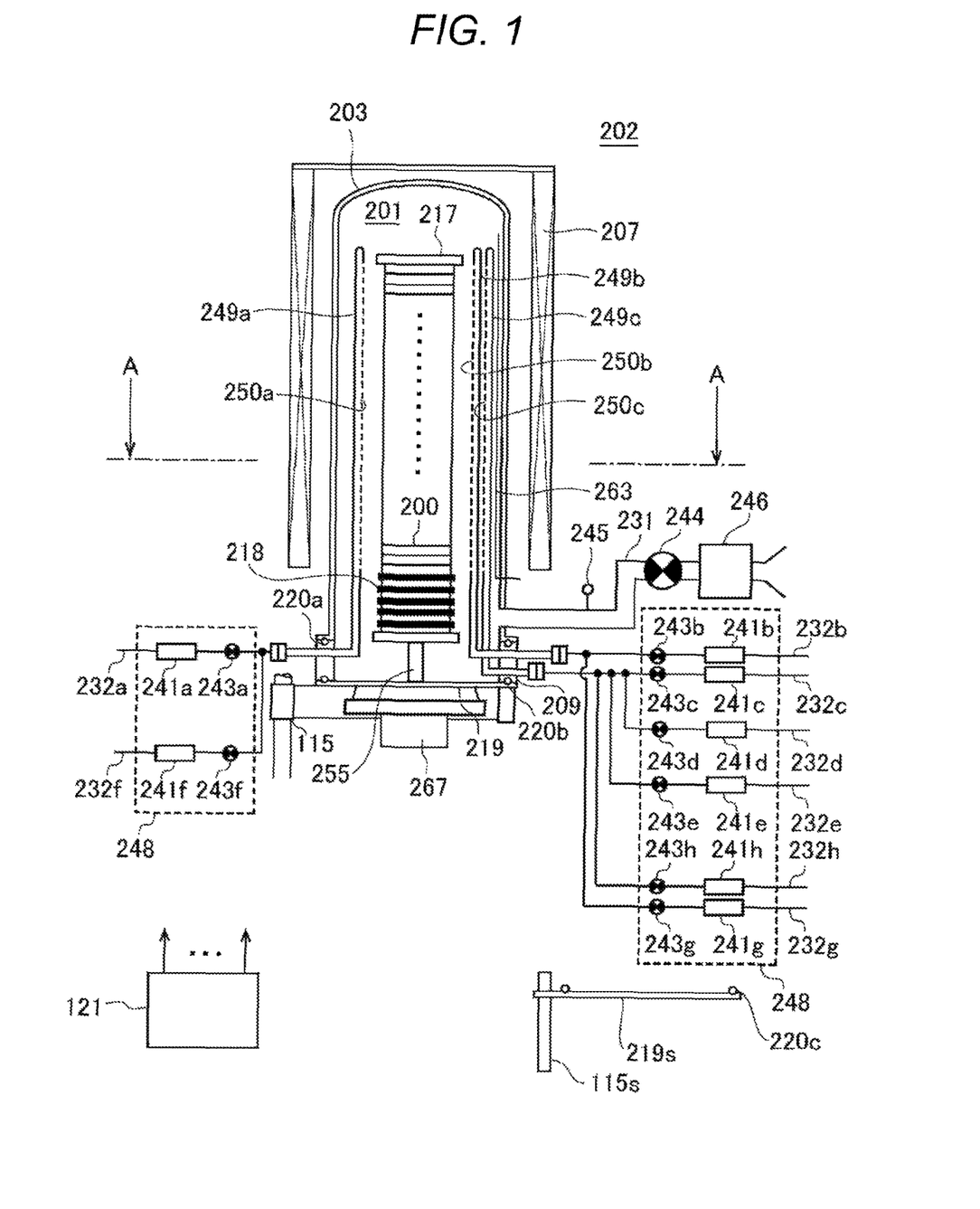
FIG. 1 is a schematic configuration diagram of a vertical process furnace of a substrate processing apparatus suitably used in an embodiment of this present disclosure and a longitudinal sectional view of a process furnace part.

As illustrated in FIG. 1, a process furnace 202 includes a heater 207 serving as a heating mechanism (temperature regulation unit). The heater 207 has a cylindrical shape and is supported to a holding plate so that the heater 207 is vertically installed. The heater 207 functions as an activation mechanism (excitation unit) that activates (excites) a gas by heat.

Inside the heater 207, a reaction tube 203 is disposed concentrically with the heater 207. The reaction tube 203 is made of a heat resistant material, such as quartz ($SiO_2$) or silicon carbide (SiC), and is formed to have a cylindrical shape with a closed upper end and an opened lower end. Under the reaction tube 203, a manifold 209 is disposed concentrically with the reaction tube 203. The manifold 209 is made of a metal, such as stainless steel (SUS), and is formed to have a cylindrical shape with opened upper and lower ends. An upper part of the manifold 209 is configured to be engaged with a lower part of the reaction tube 203 so as to support the reaction tube 203. An O-ring 220a serving as a seal member is provided between the manifold 209 and the reaction tube 203. Like the heater 207, the reaction tube 203 is vertically installed. The process vessel (reaction vessel) is configured by, primarily, the reaction tube 203 and the manifold 209. A process chamber 201 is formed in a cylindrical hollow part of the process vessel. The process chamber 201 is configured such that wafers 200 as a plurality of sheets of substrates are accommodated.

In the process chamber 201, nozzles 249a to 249c are provided to pass through a sidewall of the manifold 209. Gas supply pipes 232a to 232c are respectively connected to the nozzles 249a to 249c.

Mass flow controllers (MFCs) 241a to 241c being flow rate controllers (flow rate control units) and valves 243a to 243c being on-off valves are respectively provided in the gas supply pipes 232a to 232c in this order from an upstream side. Gas supply pipes 232d and 232e are respectively connected to a downstream side of the valve 243c of the gas supply pipe 232c. MFCs 241d and 241e and valves 243d and 243e are respectively provided in the gas supply pipes 232d and 232e in this order from the upstream side. Gas supply pipes 232f to 232h configured to supply an inert gas are respectively connected to downstream sides of the valves 243a to 243c of the gas supply pipes 232a to 232c. MFCs 241f to 241h and valves 243f to 243h are respectively provided in the gas supply pipes 232f to 232h in this order from the upstream side.

Figure 2:
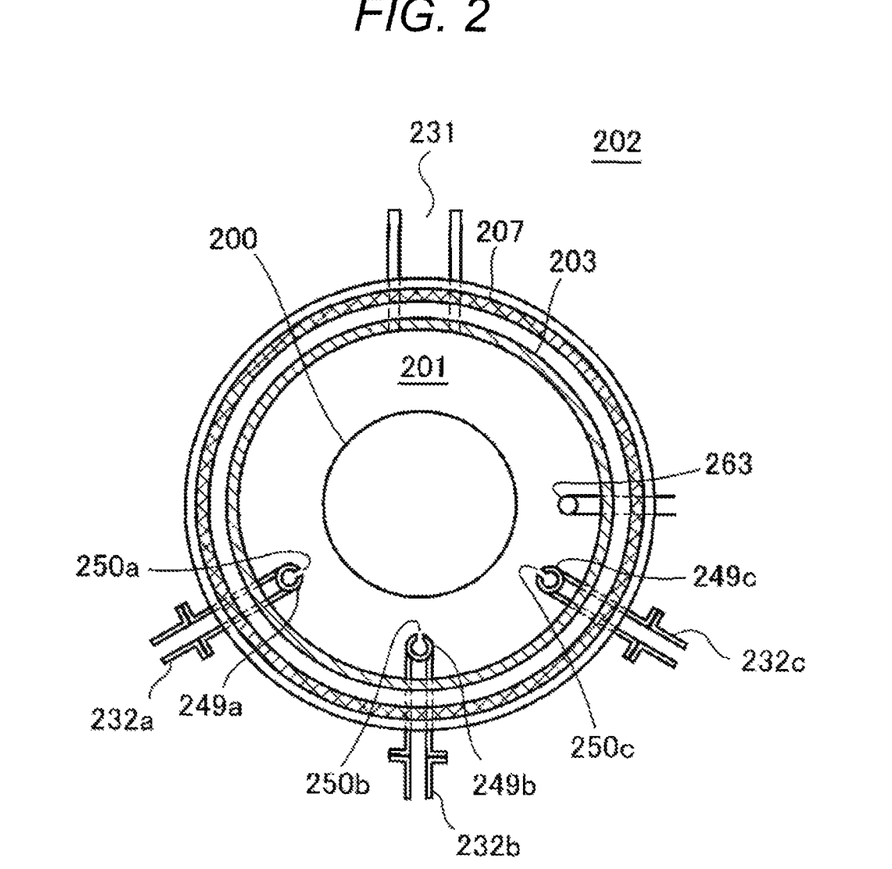
FIG. 2 is a schematic configuration diagram of a portion of the vertical process furnace of the substrate processing apparatus suitably used in the embodiment of this present disclosure and a sectional view of a portion of the process furnace, taken along line A-A of FIG. 1.

As illustrated in FIG. 2, the nozzles 249a to 249c are respectively provided in an annular space between an inner wall of the reaction tube 203 and the wafers 200, when seen in a plan view, so as to rise upward in a stacking direction of the wafers 200, extending from a lower part to an upper part of the inner wall of the reaction tube 203. That is, the nozzles 249a to 249c are provided in a region horizontally surrounding a wafer arrangement region, at a side of the wafer arrangement region in which the wafers 200 are arranged, so as to extend along the wafer arrangement region. Gas supply holes 250a to 250c configured to supply a gas are respectively provided on side surfaces of the nozzles 249a to 249c. The gas supply holes 250a to 250c are opened to face the center of the reaction tube 203, so that the gas is supplied toward the wafers 200. The gas supply holes 250a to 250c are plurally provided from the lower part to the upper part of the reaction tube 203.

A first source (first source gas), which includes at least one of an inorganic source containing a specific element (main element) and a halogen element and an organic source containing a specific element and a halogen element, is supplied from the gas supply pipes 232a and 232b to the process chamber 201 through the MFCs 241a and 241b, the valves 243a and 243b, and the nozzles 249a and 249b.

The source gas is a source of a gaseous state, for example, a gas obtained by vaporizing a source that is a liquid state under normal temperature and normal pressure, or a source that is a gaseous state under normal temperature and normal pressure. A case where the term "source" is used in this disclosure is a case that means "a source that is in a liquid state", a case that means a "source (source gas) that is in a gaseous state", or a case that means both of them. The halogen element includes chlorine (Cl), fluorine (F), bromine (Br), and iodine (I).

As the inorganic source, an inorganic halosilane source, for example, a chlorosilane source containing silicon (Si) as the specific element and Cl as the halogen element, can be used. As the chlorosilane source, for example, a chlorosilane source, such as monochlorosilane ($SiH_3Cl$, abbreviated to MCS), dichlorosilane ($SiH_2Cl_2$, abbreviated to DCS), trichlorosilane ($SiHCl_3$, abbreviated to TCS), tetrachlorosilane ($SiCl_4$, abbreviated to STC), pentachlorodisilane ($Si_2HCl_5$, abbreviated to PCDS), hexachlorodisilane ($Si_2Cl_6$, abbreviated to HCDS), octachlorotrisilane ($Si_3Cl_8$, abbreviated to OCTS), or the like can be used. In addition, as the inorganic source, a halosilane source containing a halogen element other than Cl, for example, a fluorosilane source such as tetrafluorosilane ($SiF_4$), a bromosilane source such as tetrabromosilane ($SiBr_4$), an iodosilane source such as tetraiodosilane ($SiI_4$), or the like can be used. These materials act as a Si source.

As the organic source, an organohalosilane source, for example, an organochlorosilane source containing Si, carbon (C), and Cl and containing a chemical bond of Si and C (Si—C bond), can be used. As the organochlorosilane source, for example, an alkylene chlorosilane source such as 1,2-bis(trichlorosilyl)ethane (($SiCl_3)_2C_2H_4$, abbreviated to BTCSE) and bis(trichlorosilyl)methane (($SiCl_3)_2CH_2$, abbreviated to BTCSM), an alkyl chlorosilane source such as 1,1,2,2-tetrachloro-1,2-dimethyldisilane (($CH_3)_2Si_2Cl_4$, abbreviated to TCDMDS), 1,2-dichloro-1,1,2,2-tetramethyldisilane (($CH_3)_4Si_2Cl_2$, abbreviated to DCTMDS), or the like, can be used. These materials act as a Si source and a C source.

In addition, as the first source, for example, a siloxane source containing Si and oxygen (O) and containing a chemical bond of Si and O (Si—O bond) can be used. The siloxane is a compound including Si and O as a skeleton and is a generic term of those having a Si—O—Si bond (siloxane bond). As the siloxane source, for example, an inorganic siloxane source such as hexachlorodisiloxane ($Si_2Cl_6O$, abbreviated to HCDO) and an organic siloxane source such as hexamethyldisiloxane (($Si(CH_3)_3)_2O$, abbreviated to HMDSO) can be used. The HCDO is an inorganic halosilane source and acts as a Si source and an O source. The HMDSO acts as a Si source, an O source, and a C source.

In addition, as the first source, a silazane source containing Si and nitrogen (N) and containing a chemical bond of Si and N (Si—N bond) can be used. The silazane is a compound including Si and N as a skeleton and is a generic term of those having a silazane bond such as a Si—N—Si bond, a Si—N bond, or the like. As the silazane source, for example, an inorganic silazane source such as hexachlorodisilazane (($Cl_3Si)_2NH$, abbreviated to HCDSN) or trisilylamine ($N(SiH_3)_3$, abbreviated to TSA) and an organic silazane source such as hexamethyldisilazane ([($CH_3)_3Si]_2NH$, abbreviated to HMDSN), tetramethyldisilazane ([H($CH_3)_2Si]_2NH$), abbreviated to TMDSN), or the like can be used. The HCDSN is also an inorganic halosilane source. The HCDSN or the TSA acts as a Si source and an N source. The HMDSN or the TMDSN acts as a Si source, an N source, and a C source.

Second to fourth sources (second to fourth source gases), which include at least one of amine, organic hydrazine, hydrogen nitride, and organic borane, are supplied from the gas supply pipes 232c to 232e to the process chamber 201 through the MFCs 241c to 241e, the valves 243c to 243e, and the nozzle 249c.

As the amine, for example, monoethylamine ($C_2H_5NH_2$, abbreviated to MEA), diethylamine (($C_2H_5)_2NH$, abbreviated to DEA), triethylamine (($C_2H_5)_3N$, abbreviated to TEA), monomethylamine ($CH_3NH_2$, abbreviated to MMA), dimethylamine (($CH_3)_2NH$, abbreviated to DMA), trimethylamine (($CH_3)_3N$, abbreviated to TMA), monopropylamine ($C_3H_7NH_2$ abbreviated to MPA), dipropylamine (($C_3H_7)_2NH$, abbreviated to DPA), tripropylamine (($C_3H_7)_3N$, abbreviated to TPA), monoisopropylamine (($CH_3)_2CHNH_2$, abbreviated to MIPA), diisopropylamine ([($CH_3)_2CH]_2NH$, abbreviated to DIPA), triisopropylamine ([($CH_3)_2CH]_3N$, abbreviated to TIPA), monobutylamine ($C_4H_9NH_2$, abbreviated to MBA), dibutylamine (($C_4H_9)_2NH$, abbreviated to DBA), tributylamine (($C_4H_9)_3N$, abbreviated to TBA), monoisobutylamine (($CH_3)_2CHCH_2NH_2$ abbreviated to MIBA), diisobutylamine ([($CH_3)_2CHCH_2]_2NH$, abbreviated to DIBA), and triisobutylamine ([($CH_3)_2CHCH_2]_3N$, abbreviated to TIBA) can be used. These materials act as an N source and a C source.

As the organic hydrazine, for example, monomethylhydrazine (($CH_3)HN_2H_2$, abbreviated to MMH), dimethylhydrazine (($CH_3)_2N_2H_2$, abbreviated to DMH), and trimethylhydrazine (($CH_3)_2N_2(CH_3)H$, abbreviated to TMH) can be used. These materials act as an N source and a C source.

As the hydrogen nitride, for example, ammonia ($NH_3$), diazene ($N_2H_2$), hydrazine ($N_2H_4$), and $N_3H_8$ can be used. These materials act as an N source.

As the organic borane, for example, monoethylborane ($C_2H_5BH_2$, abbreviated to MEB), diethylborane (($C_2H_5)_2BH$, abbreviated to DEB), and triethylborane (($C_2H_5)_3B$, abbreviated to TEB) can be used. These materials act as a boron (B) source and a C source.

As an inert gas, for example, nitrogen ($N_2$)-containing gases are respectively supplied from the gas supply pipes 232f to 232h to the process chamber 201 through the MFCs 241f to 241h, the valves 243f to 243h, the gas supply pipes 232a to 232c, and the nozzles 249a to 249c. In addition to the $N_2$ gas, a rare gas, such as Ar gas, a He gas, a Ne gas, a Xe gas, or the like can also be used as the inert gas.

A supply system (first supply system) configured to supply the first source described above is configured by, mainly, the gas supply pipes 232a and 232b, the MFCs 241a and 241b, and the valves 243a and 243b. Supply systems (second to fourth supply systems) configured to supply the second to fourth sources described above are configured by, mainly, the gas supply pipes 232c to 232e, the MFCs 241c to 241e, and the valves 243c to 243e. An inert gas supply system is configured by, mainly, the gas supply pipes 232f to 232h, the MFCs 241f to 241h, and the valves 243f to 243h.

One or all of the various supply systems described above may be configured as an integrated supply system 248 in which the valves 243a to 243h, the MFCs 241a to 241h, or the like are integrated. The integrated supply system 248 is connected to each of the gas supply pipes 232a to 232h and is configured such that the operations of supplying various gases into the gas supply pipes 232a to 232h, that is, the operations of opening and closing the valves 243a to 243h, or the operations of adjusting the flow rates by the MFCs 241a to 241h are controlled by a controller 121 described later. The integrated supply system 248 is configured as an integration-type or division-type integrated unit, and it is possible to perform attachment and detachment with respect to the gas supply pipes 232a to 232h or the like on an integrated unit basis, and it is possible to perform maintenance, replacement, expansion, or the like of the integrated supply system 248 on an integrated unit basis.

An exhaust pipe 231 is provided in the reaction tube 203 so as to exhaust the atmosphere of the process chamber 201. In the exhaust pipe 231, a vacuum pump 246 serving as a vacuum exhaust device is connected through a pressure sensor 245 serving as a pressure detector (pressure detection unit), which detects a pressure in the process chamber 201, and an auto pressure controller (APC) valve 244 serving as a pressure regulator (pressure regulation unit). The APC valve 244 is configured to perform a vacuum exhaust or a vacuum exhaust stop with respect to the process chamber 201 by opening or closing the valve while the vacuum pump 246 is operating, and to regulate the pressure in the process chamber 201 by adjusting the degree of valve opening based on pressure information detected by the pressure sensor 245 while the vacuum pump 246 is operating. An exhaust system is configured by, primarily, the exhaust pipe 231, the AFC valve 244, and the pressure sensor 245. The vacuum pump 246 may be included in the exhaust system.

Under the manifold 209, a seal cap 219 is provided as a furnace throat lid that can airtightly close a lower end opening of the manifold 209. The seal cap 219 is made of a metal such as stainless steel (SUS) and is formed to have a disk shape. On the top surface of the seal cap 219, an O-ring 220b is provided as a seal member that abuts against the lower end of the manifold 209. A rotation mechanism 267 that rotates a boat 217 described below is installed under the seal cap 219. A rotational shaft 255 of the rotation mechanism 267 passes through the seal cap 219 and is connected to the boat 217. The rotation mechanism 267 is configured to rotate the wafers 200 by rotating the boat 217. The seal cap 219 is configured such that the seal cap 219 is moved upward and downward by a boat elevator 115 serving as an elevation mechanism installed outside the reaction tube 203. The boat elevator 115 is configured as a transfer device (transfer mechanism) that loads the boat 217 (that is, the wafers 200) into the process chamber 201 or unloads the boat 217 (that is, the wafers 200) from the process chamber 201 by moving the seal cap 219 upward or downward. In addition, under the manifold 209, a shutter 219s is provided as a furnace throat lid that can airtightly close the lower end opening of the manifold 209 while the seal cap 219 is moved downward by the boat elevator 115. The shutter 219s is made of a metal such as stainless steel (SUS) and is formed to have a disk shape. On the top surface of the shutter 219s, an O-ring 220c is provided as a seal member that abuts against the lower end of the manifold 209. The opening/closing operation (the upward/downward moving operation, the rotating operation, or the like) of the shutter 219s is controlled by a shutter opening/closing mechanism 115s.

The boat 217 serving as a substrate support is configured such that a plurality of sheets of wafers 200, for example, 25 to 200 wafers, are vertically aligned and supported in a horizontal posture, with their centers aligned with one another, in multiple stages, that is, arranged spaced apart from one another at predetermined intervals. The boat 217 is made of, for example, a heat resistant material such as quartz or SiC. Under the boat 217, a heat insulation plate 218, which is made of, for example, a heat resistant material such as quartz or SiC, is configured to be supported in multiple stages.

A temperature sensor 263 serving as a temperature detector is installed in the reaction tube 203. An amount of current to be supplied to the heater 207 is adjusted based on temperature information detected by the temperature sensor 263, so that the temperature in the process chamber 201 has a desired temperature distribution. The temperature sensor 263 is provided along the inner wall of the reaction tube 203.

Figure 3:
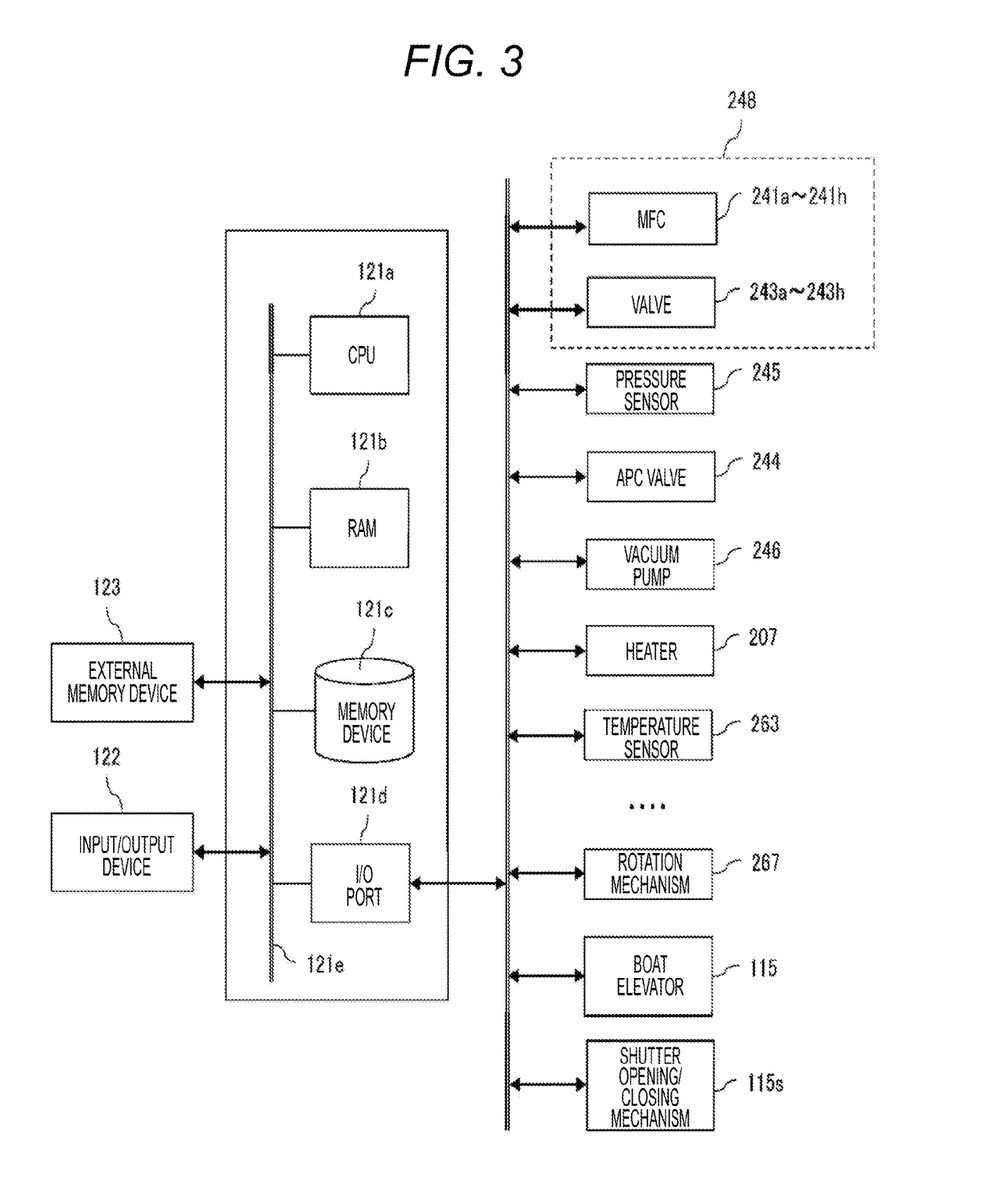
FIG. 3 is a schematic configuration diagram of a controller of the substrate processing apparatus suitably used in the embodiment of this present disclosure and a block diagram of a control system of the controller.

As illustrated in FIG. 3, a controller 121 being a control unit (control device) is configured by a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122, which is configured as, for example, a touch panel or the like, is connected to the controller 121.

The memory device 121c is configured by, for example, a flash memory, a hard disk drive (HDD), or the like. In the memory device 121c, a control program for controlling an operation of a substrate processing apparatus or a process recipe including procedures or conditions of a film-forming process described later is stored to be readable. The process recipe is a combination of procedures of a film-forming process described later so as to obtain a desired result when the procedures are performed by the controller 121, and functions as a program. Hereinafter, the process recipe, the control program, and the like will be simply and collectively referred to as a program. In addition, the process recipe is simply referred to as a recipe. When the term "program" is used in this present disclosure, it may be understood as including only a recipe alone, only a control program alone, or both of the recipe and the control program. The RAM 121b is configured as a memory area (work area) in which a program or data read by the CPU 121a is temporarily retained.

The I/O port 121d is connected to the MFCs 241a to 241h, the valves 243a to 243h, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read and execute the control program from the memory device 121c and to read the recipe from the memory device 121c according to an input of an operation command from the I/O device 122, or the like. According to the contents of the read recipe, the CPU 121a is configured to control the operation of adjusting the flow rates of various gases by using the MFCs 241a to 241h, the operation of opening and closing the valves 243a to 243h, the operation of opening and closing the APC valve 244, the operation of adjusting the pressure by the APC valve 244 based on the pressure sensor 245, the start and stop of the vacuum pump 246, the operation of adjusting the temperature of the heater 207 based on the temperature sensor 263, the operation of adjusting the rotation and the rotating speed of the boat 217 by the rotation mechanism 267, the operation of moving the boat 217 upward and downward by using the boat elevator 115, the operation of opening and closing the shutter 219s by the shutter opening/closing mechanism 115s, and the like.

The controller 121 can be configured by installing, on a computer, the program stored in an external memory device (for example, a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a non-transitory computer-readable recording medium. Hereinafter, the memory device 121c and the external memory device 123 may also be simply and collectively referred to as a recording medium. When the term "recording medium" is used in this present disclosure, it may be understood as including only the memory device 121c alone, only the external memory device 123 alone, or both of the memory device 121c and the external memory device 123. The provision of the program to the computer may be performed by using a communication unit, such as the Internet, dedicated lines, or the like, without using the external memory device 123.

(2) FILM-FORMING PROCESS

As one of the processes of manufacturing a semiconductor device, an example of a sequence of forming a film on a wafer 200 as a substrate by using the above-described substrate processing apparatus will be described with reference to FIG. 4A. In the following description, operations of the respective elements constituting the substrate processing apparatus are controlled by the controller 121.

Figure 4A:
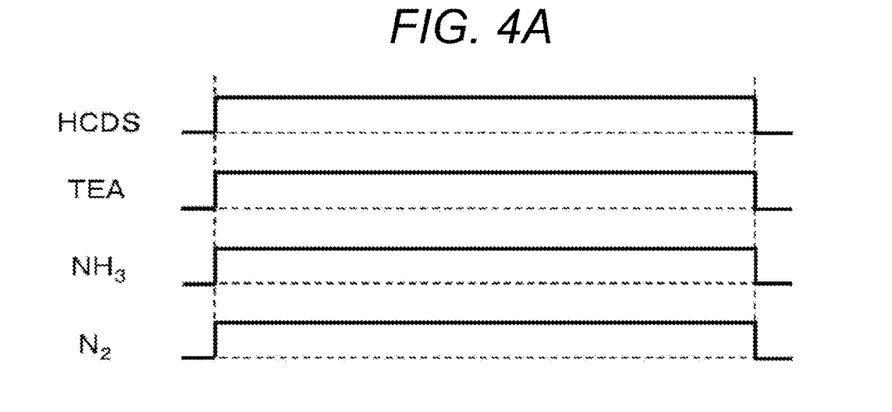
FIG. 4A is a diagram illustrating a film-forming sequence according to an embodiment of this present disclosure.

The film-forming sequence illustrated in FIG. 4A forms a silicon carbonitride film (SiCN film) as a film including Si, C, and N on the wafer 200 by overlapping the following during at least a certain period: (a) supplying an HCDS gas as a first source to the wafer 200; (b) supplying a TEA gas as a second source to the wafer 200; and (c) supplying an NH$_3$ gas as a third source to the wafer 200.

In this present disclosure, for convenience, the film-forming sequence illustrated in FIG. 4A may be represented as follows. In the following descriptions of modification examples, the same notation is used.

HCDS+TEA+NH$_3$→SiCN (Wafer Charging and Boat Loading)

When a plurality of sheets of wafers 200 are charged into the boat 217 (wafer charging), the shutter 219s is moved by the shutter opening/closing mechanism 115s and the lower end opening of the manifold 209 is opened (shutter opening). After that, as illustrated in FIG. 1, the boat 217 that supports the plurality of sheets of wafers 200 is lifted by the boat elevator 115 and is loaded into the process chamber 201 (boat loading). In this state, the seal cap 219 is in a state of sealing the lower end of the manifold 209 through the O-ring 220b.

(Pressure and Temperature Adjusting Step)

The inside of the process chamber 201, that is, the space where the wafers 200 are present, is vacuum-exhausted (exhausted under reduced pressure) to have a desired pressure (degree of vacuum) by the vacuum pump 246. In this case, the pressure in the process chamber 201 is measured by the pressure sensor 245, and the APC valve 244 is feedback-controlled based on information about the measured pressure. The vacuum pump 246 maintains a full-time operating state at least until the processing on the wafers 200 is completed. In addition, the wafers 200 in the process chamber 201 are heated by the heater 207 so as to have a desired deposition temperature. In this case, an amount of current supplied to the heater 207 is feedback-controlled based on the temperature information detected by the temperature sensor 263, so that the inside of the process chamber 201 has a desired temperature distribution. The heating of the inside of the process chamber 201 by the heater 207 is continuously performed at least until the processing on the wafers 200 is completed. In addition, the rotation of the boat 217 and the wafers 200 is started by the rotation mechanism 267. The rotation of the boat 217 and the wafers 200 by the rotation mechanism 267 is continuously performed at least until the processing on the wafers 200 is completed.

(Film-Forming Step)

In this step, an HCDS gas, a TEA gas, and an NH$_3$ gas are simultaneously supplied to the wafer 200. That is, these gas supply periods are overlapped. Specifically, the valves 243a, 243c, and 243d are opened so that these gases flow into the gas supply pipes 232a, 232c, and 232d. The HCDS gas, the TEA gas, and the NH$_3$ gas, the flow rates of which are respectively controlled by the NIFCs 241a, 241c, and 241d, are supplied into the process chamber 201 through the nozzles 249a and 249c and are exhausted from the exhaust pipe 231. At this time, the HCDS gas, the TEA gas, and the NH$_3$ gas are supplied to the wafer 200 together, that is, at the same time. At this time, the valves 243f to 243h may be opened at the same time so that an N$_2$ gas flows into the gas supply pipes 232f to 232h. The N$_2$ gas, the flow rate of which is adjusted by the MFCs 241f to 241h, is supplied to the process chamber 201 and is exhausted from the exhaust pipe 231.

At this time, the temperature (deposition temperature) of the wafer 200 is set to be a certain temperature within a range of, for example, 500° C. to 700° C., and preferably 550° C. to 650° C. Also, the pressure (deposition pressure) in the process chamber 201 is set to be a certain pressure within a range of, for example, 1 Pa to 1,000 Pa, and preferably 10 Pa to 200 Pa. The above-described temperature range includes a temperature at which the film-forming process does not proceed in a case where only HCDS and TEA are present in the process chamber 201 (in a case where NH$_3$ is not present).

When the deposition temperature is less than 500° C. (or when the deposition pressure is less than 1 Pa), a film-forming reaction described later hardly proceeds on the wafer 200, a practical deposition rate may not be obtained, and productivity may be reduced. In addition, a poor-quality film, which includes a large amount of dangling bonds, may be formed on the wafer 200. By setting the deposition temperature to be 500° C. or more (or by setting the deposition pressure to be 1 Pa or more), the film-forming reaction on the wafer 200 is progressed to thereby obtain a practical deposition rate. In addition, the number of dangling bonds included in the film formed on the wafer 200 is reduced to thereby improve the film quality of the film. By setting the deposition temperature to be 550° C. or more (or by setting the deposition pressure to be 10 Pa or more), the film-forming reaction on the wafer 200 is further accelerated to thereby further increase a deposition rate. In addition, the number of dangling bonds included in the film formed on the wafer 200 is further reduced to thereby further improve the film quality of the film.

When the deposition temperature is more than 700° C. (or when the deposition pressure is more than 1,000 Pa), HCDS may be easily thermally decomposed and it may be difficult to progress the film-forming process using the catalytic action of $NH_3$ described later. In addition, a gas phase reaction in the process chamber 201 becomes excessive, and the number of particles generated in the process chamber 201 may increase. By setting the deposition temperature to be 700° C. or less (or by setting the deposition pressure to be 1,000 Pa or less), the thermal decomposition of HCDS is suppressed and it is possible to progress the film-forming process using the catalytic action of $NH_3$. In addition, it is possible to suppress the generation of particles in the process chamber 201. By setting the deposition temperature to be 650° C. or less (or by setting the deposition pressure to be 200 Pa or less), the thermal decomposition of HCDS is more reliably suppressed and it is possible to more reliably progress the film-forming process using the catalytic action of $NH_3$. In addition, it is possible to further suppress the generation of particles in the process chamber 201.

The supply flow rate of the HCDS gas is set to be a certain flow rate within a range of, for example, 10 sccm to 1,000 sccm, and preferably 50 sccm to 100 sccm. The supply flow rate of the TEA gas is set to be a certain flow rate within a range of, for example, 50 sccm to 5,000 sccm, and preferably 10 sccm to 1,000 sccm. The supply flow rate of the $NH_3$ gas is set to be a certain flow rate within a range of, for example, 50 sccm to 5,000 sccm, and preferably 10 sccm to 1,000 sccm. When the $N_2$ gas flows, the supply flow rate of the gas is set to be a certain flow rate within a range of, for example, 1 sccm to 10,000 sccm. Each of these supply flow rates of the gases can be appropriately determined according to a composition of a film to be formed on the wafer 200.

By simultaneously supplying the HCDS gas, the TEA gas, and the $NH_3$ gas to the wafer 200 under the above-described condition, it is possible to appropriately react these gases in the process chamber 201. That is, a halogen element (Cl) contained in HCDS can react with an ethyl group ($CH_2CH_3$) contained in the TEA gas, and Cl contained in HCDS can react with hydrogen (H) contained in the $NH_3$ gas. At least a part of a plurality of Cl atoms contained in HCDS can be separated from HCDS, at least a part of a plurality of ethyl groups contained in TEA can be separated from TEA, and at least a part of a plurality of H atoms contained in $NH_3$ can be separated from $NH_3$. N of TEA from which the ethyl group is separated, or N of $NH_3$ from which H is separated, and Si of HCDS from which Cl is separated are bonded to form a Si—N bond, and a material containing this bond can be deposited on the wafer 200. Also, C contained in the ethyl group separated from TEA and Si contained in HCDS from which Cl is separated are bonded to form a Si—C bond, and a material containing this bond can be deposited on the wafer 200. Therefore, a SiCN film can be formed on the wafer 200. This film is a high-quality film containing the Si—N bond or the Si—C bond.

As described above, the temperature condition of the present embodiment includes a temperature at which the film-forming process does not proceed in a case where only HCDS and TEA are present in the process chamber 201. It is considered that the film-forming process can be progressed even under these temperature conditions due to the catalytic action of $NH_3$ supplied at the same time as HCDS and TEA. In a case where the HCDS gas, the TEA gas, and the $NH_3$ gas are simultaneously supplied to the wafer 200 in the process chamber 201, it is possible to reduce the deposition temperature by, for example, about 50° C. to about 100° C., and it is possible to progress the process at a practical deposition rate even under the above-described temperature condition, as compared with a case where the HCDS gas and the TEA gas are simultaneously supplied and the gas is not supplied. The "catalyst" is a material that does not change itself before and after a chemical reaction, but changes a rate of reaction. In this regard, NH in the reaction system of the present embodiment changes the rate of reaction as described above, but at least a part of $NH_3$ itself changes before and after the chemical reaction. That is, $NH_3$ in the reaction system of the present embodiment acts as a catalyst, but strictly, $NH_3$ is not a "catalyst". Therefore, $NH_3$ in the reaction system of the present embodiment can be referred to as a "pseudo catalyst".

When the SiCN film is formed, Cl contained in the HCDS gas or H contained in the TEA gas or the $NH_3$ gas reacts with each other to constitute a gaseous by-product, such as a hydrochloric acid (HCl), chlorine ($Cl_2$), hydrogen ($H_2$), or the like, and is desorbed from the surface of the wafer 200 without being taken into the film and then removed from the process chamber 201. Therefore, the SiCN film formed on the wafer 200 is a high-quality film in which an amount of impurities such as Cl or H contained in the film is small.

(After-Purge Step and Atmospheric Pressure Returning Step)

After the SiCN film having a desired composition and a desired film thickness is formed on the wafer 200, the valves 243a, 243c, and 243d are closed and the supply of various sources into the process chamber 201 is stopped. In addition, an $N_2$ gas is supplied from each of the gas supply pipes 232f to 232h to the process chamber 201 and is exhausted from the exhaust pipe 231. The $N_2$ gas acts as a purge gas. Therefore, the inside of the process chamber 201 is purged so that the reaction by-product or the gas remaining in the process chamber 201 is removed from the process chamber 201 (after-purge). After that, the atmosphere in the process chamber 201 is replaced with the inert gas (inert gas replacement) and the pressure in the process chamber 201 is returned to the atmospheric pressure (atmospheric pressure returning).

(Boat Unloading and Wafer Discharging)

After that, the seal cap 219 is moved downward by the boat elevator 115. The lower end of the manifold 209 is opened and the processed wafers 200 are unloaded from the lower end of the manifold 209 to the outside of the reaction tube 203 in a state of being supported to the boat 217 (boat unloading). After the boat unloading, the shutter 219s is moved and the lower end opening of the manifold 209 is sealed through the O-ring 220c by the shutter 219s (shutter closing). After the processed wafers 200 are unloaded to the outside of the reaction tube 203, the processed wafers 200 are discharged from the boat 217 (wafer discharging).

According to the present embodiment, one or more effects described below can be obtained.

(a) By simultaneously supplying the HCDS gas, the TEA gas, and the $NH_3$ gas to the wafer 200, the deposition temperature can be reduced, as compared with a case where the $NH_3$ gas among these gases is not supplied. That is, by using the catalytic action of the NH gas, it is possible to extend the range of the process condition (process window) in which the film-forming process can be progressed. As in the present embodiment, the in-plane film thickness uniformity or the in-plane film quality uniformity of the film formed on the wafer 200 can be improved by performing the film-forming process under the low temperature condition. In addition, it is possible to improve the composition ratio controllability of the film formed on the wafer 200. In addition, it is possible to suppress the generation of Particles in the process chamber 201 and to improve the quality of the film-forming process. In addition, heat history can be well controlled by reducing a thermal damage experienced by the wafer 200.

(b) By using the halogen element-containing source such as the HCDS gas as the first source, the quality of the film-forming process can be improved, as compared with the case of using the halogen element-free source such as the disilane ($Si_2H_6$) gas as the first source. This is because, in order to form the SiCN film on the wafer 200 under the above-described temperature condition by using the $Si_2H_6$ gas, the TEA gas, and the $NH_3$ gas, it is necessary to confine these sources in the process chamber 201 and increase the pressure in the process chamber 201. However, when such a process is performed, the particles or by-products may be easily generated in the process chamber 201 and the film quality of the film formed on the wafer 200 may be deteriorated. In the present embodiment, due to the action of the halogen element contained in the first source, the film-forming process can be progressed under the above-described temperature condition without confining the sources in the process chamber 201 or increasing the pressure in the process chamber 201. As a result, it is possible to avoid the generation of particles described above and to improve the film quality of the film formed on the wafer 200.

(c) The deposition temperature can be further reduced by appropriately selecting a type of amine included in the second source. According to the intensive research of the inventors or the like, it is known that as amine whose degree of substitution is small is selected as amine included in the second source, that is, as the number of alkyl ligands coordinating to N of the selected amine is smaller, the deposition temperature can be reduced. In a case where the DEA gas being a secondary amine (two ethyl ligands) is used as the second source, the deposition temperature can be reduced, as compared with a case where the TEA gas being a tertiary amine (three ethyl ligands) is used as the second source. In addition, in a case where the MEA gas being a primary amine (one ethyl ligand) is used as the second source, the deposition temperature can be further reduced.

(d) Since the TEA gas acting as the C source is used as the second source and C is added to the film formed on the wafer 200, this film (SiCN film) can be formed as a film having high resistance to hydrogen fluoride (HF) or the like, that is, high etching resistance, as compared with a C-free film (SiN film). As a result, this film can be suitably used as, for example, a hard mask. In particular, in the present embodiment, the addition of C to the film formed on the wafer 200 can be performed in the form of the Si—C bond, and the etching resistance of the film can be more reliably improved.

(e) An amount of C added to the film formed on the wafer 200 can be adjusted in a wide range by appropriately selecting a type of amine included in the second source. For example, since the TPA gas, the TIPA gas, the TBA gas, the TIBA gas, or the like, which includes a larger amount of C than the TEA gas, is used as the second source, it is possible to increase an amount of C added to the film formed on the wafer 200, as compared with a case where the TEA gas is used as the second source. In addition, for example, since the MMA gas, the DMA gas, the TNA gas, the DEA gas, the MEA gas, or the like, which includes a smaller amount of C than the TEA gas, is used as the second source, it is possible to decrease an amount of C added to the film formed on the wafer 200, as compared with a case where the TEA gas is used as the second source. According to the present embodiment, a C concentration of the SiCN film can be controlled in a wide range of, for example, 1 at % to 50 at %.

(f) By simultaneously supplying the HCDS gas, the TEA gas, and the $NH_3$ gas to the wafer 200, it is possible to reduce an amount of impurities such as Cl, H, or the like contained in the film formed on the wafer 200, as compared with the case of non-simultaneously supplying these gases. This is because, by simultaneously supplying these gases, it is possible to efficiently perform the mutual reaction of these gases, as compared with the case of non-simultaneously supplying these gases. As described above, Cl contained in the HCDS gas or H contained in the TEA gas or the $NH_3$ gas reacts with each other to constitute a gaseous by-product and is removed from the process chamber 201 without being taken into the film.

(g) By simultaneously supplying the HCDS gas, the TEA gas, and the $NH_3$ gas to the wafer 200, it is possible to increase the deposition rate and improve the productivity of the film-forming process, as compared with the case of non-simultaneously supplying these gases. In addition, the control of the film-forming process can be simplified.

(h) The same effects as described above can also be obtained even when an inorganic source or an organic source other than HCDS is used as the first source, amine or organic hydrazine other than TEA is used as the second source, and hydrogen nitride other than $NH_3$ is used as the third source.

(4) MODIFICATION EXAMPLES

The film-forming step according to the present embodiment can be modified as in the following modification examples.

Modification Example 1

As in the following film-forming sequence, the second source may include a first amine (for example, TEA), and the third source may include a second amine (for example, DEA) having a different chemical structure from that of the first amine. In the present modification example, the same effects as those of the film-forming sequence illustrated in FIG. 4A can also be obtained. That is, by making the degree of substitution of one of the first amine and the second amine be smaller than that of the other, it is possible to obtain an effect of reducing a deposition temperature as in the film-forming sequence illustrated in FIG. 4A. In addition, according to the present modification example, by using two types of sources acting as a C source, the film formed on the wafer 200 can be made to be a C-richer film than the film formed by the film-forming sequence illustrated in FIG. 4A.

Modification Example 2

As in the following film-forming sequence, an HCDS gas, a TEA gas, a DEA gas, and an $NH_3$ gas may be respectively used as first to fourth sources and these gases may be simultaneously supplied to the wafer 200. That is, the second source may include a first amine (TEA), the third source may include a second amine (DEA) having a different chemical structure from that of the first amine, and a step of supplying the fourth source including hydrogen nitride ($NH_3$) may be performed. In the present modification example, the same effects as those of the film-forming sequence illustrated in FIG. 4A or the film-forming sequence of the modification example 1 can also be obtained.

Modification Example 3

As in the following film-forming sequence, a gas including an HCDS gas and a TCDMDS gas, that is, both an inorganic source and an organic source, may be used as a first source, a TEA gas and an gas may be respectively used as a second source and a third source, and these gases may be simultaneously supplied to the wafer 200. In the present modification example, the same effects as those of the film-forming sequence illustrated in FIG. 4A can also be obtained. In addition, according to the present modification example, by using two types of sources acting as a C source, the SiCN film formed on the wafer 200 can be made to be a C-richer film than the film formed by the film-forming sequence illustrated in FIG. 4A.

CDS+TCDMDS+TEA+NH₃→C-rich SiCN

Modification Example 4

As in the following film-forming sequence, an HCDS gas and a TCDMDS gas may be used as a first source, a TEA gas, a DEA gas, and an NH gas may be respectively used as second to fourth sources, and these gases may be simultaneously supplied to the wafer 200. In the present modification example, the same effects as those of the film-forming sequence illustrated in FIG. 4A can also be obtained. In addition, according to the present modification example, by using three types of sources acting as a C source, the film formed on the wafer 200 can be made to be a C-richer film than the film formed by the film-forming sequence illustrated in FIG. 4A.

HCDS+TCDMDS+TEA+DEA+NH₃→C-rich SiCN

Modification Example 5

As in the following film-forming sequence, an HCDS gas or an HCDS gas and a TCDMDS gas may be used as a first source, a TEB gas and at least one of a TEA gas, a DEA gas, and an NH₃ gas may be used as another source group, and these gases may be simultaneously supplied to the wafer 200 to form a film containing Si, B, C, and N, that is, a silicon boron carbonitride film (SiBCN film), on the wafer 200. In the present modification example, the same effects as those of the film-forming sequence illustrated in FIG. 4A can also be obtained. In addition, according to the present modification example, in the case of using two or more types of sources acting as a C source, the film formed on the wafer 200 can be made to be a C-rich film.

HCDS+TEA+TEB→C-rich SiBCN

HCDS+NH₃+TEB→SiBCN

HCDS+TEA+NH₃+TEB→C-rich SiBCN

HCDS+TEA+DEA+TEB→C-rich SiBCN

HCDS+TCDMDS+TEA+NH₃+TEB→C-rich SiBCN

HCDS+TCDMDS+TEA+DEA+TEB→C-rich SiBCN

Modification Example 6

As in the following film-forming sequence, a TCDMDS gas may be used as a first source, at least two types of gases selected from a TEA gas, a DEA gas, an NH₃ gas, and a TEB gas may be used as another source group, and these gases may be simultaneously supplied to the wafer 200 to form a SiCN film or a SiBCN film on the wafer 200. In the present modification example, the same effects as those of the film-forming sequence illustrated in FIG. 4A can also be obtained. In addition, according to the present modification example, in the case of using two or more types of sources acting as a C source, the film formed on the wafer 200 can be made to be a C-rich film.

TCDMDS+TEA+NH₃→C-rich SiCN

TCDMDS+TEA+DEA→C-rich SiCN

TCDMDS+TEA+DEA+NH₃→C-rich SiCN

TCDMDS+TEA+TEB→C-rich SiBCN

TCDMDS+NH₃+TEB→C-rich SiBCN

TCDMDS+TEA+NH₃+TEB→C-rich SiBCN

TCDMDS+TEA+DEA+TEB→C-rich SiBCN

Modification Example 7

As in the following film-forming sequence, an HMDSO gas may be used as a first source, at least two types of gases selected from a TEA gas, a DEA gas, an NH₃ gas, and a TEB gas may be used as another source group, and these gases may be simultaneously supplied to the wafer 200 to form a silicon oxycarbonitride film (SiOCN film) containing Si, O, C, and N, or a silicon boron oxycarbonitride (SiBOCN film) containing Si, B, O, C, and N on the wafer 200. In the present modification example, the same effects as those of the film-forming sequence illustrated in FIG. 4A can also be obtained. In addition, according to the present modification example, both C and O can be added to the film formed on the wafer 200 with high concentration. According to the present modification example, since the first source that can also act as the O source is used, O can be added to the film without using an oxidizing agent such as an O₂ gas or the like. As a result, it is possible to avoid desorption of C from the film due to the influence of the oxidizing agent. According to the present modification example, in the case of using two or more types of sources acting as a C source, the film formed on the wafer 200 can be made to be a C-rich film.

HMDSO+TEA+NH₃→C-rich SiOCN

HMDSO+TEA+DEA→C-rich SiOCN

HMDSO+TEA+DEA+NH₃→C-rich SiOCN

HMDSO+TEA+TEB→C-rich SiBOCN

HMDSO+NH₃+TEB→C-rich SiBOCN

HMDSO+TEA+NH₃+TEB→C-rich SiBOCN

HMDSO+TEA+DEA+TEB→C-rich SiBOCN

Modification Example 8

As in the following film-forming sequence, an HCDS gas and a TCDMDS gas, or a TCDMDS gas and a DCTMDS gas may be used as a first source, at least one of a TEA gas, an NH₃ gas, and a TEB gas may be used as another source group, and these gases may be simultaneously supplied to the wafer 200 to form a SiCN film or a SiBCN film on the wafer 200. In the present modification example, the same effects as those of the film-forming sequence illustrated in FIG. 4A can also be obtained. In addition, according to the present modification example, in the case of using two or more types of sources acting as a C source, the film formed on the wafer 200 can be made to be a C-rich film.

HCDS+TCDMDS+NH₃→SiCN

HCDS+TCDMDS+TEA→C-rich SiCN

HCDS+TCDMDS+TEB→C-rich SiBCN

TCDMDS+DCTMDS+NH₃→C-rich SiCN

TCDMDS+DCTMDS+TEA→C-rich SiCN

TCDMDS+DCTMDS+TEB→C-rich SiBCN

Modification Example 9

As in the following film-forming sequence, an HCDO gas and a TCDMDS gas, an HMDSO gas and a TCDMDS gas, or an HCDSN gas and a TCDMDS gas may be used as a first source, at least one of a TEA gas, an gas, and a TEB gas may be used as another source group, and these gases may be simultaneously supplied to the wafer 200 to form a SiOCN film, a SiBOCN film, a SiCN film, and a SiBCN film on the wafer 200. In the present modification example, the same effects as those of the film-forming sequence illustrated in FIG. 4A can also be obtained. In addition, according to the present modification example, in a case where the first source includes an HCDO gas or an HMDSO gas, both C and O can be added to the film formed on the wafer 200 with high concentration, as in the modification example 7. In addition, according to the present modification example, in the case of using two or more types of sources acting as a C source, the film formed on the wafer 200 can be made to be a C-rich film.

HCDO+TCDMDS+NH₃→SiOCN

HCDO+TCDMDS+TEA→C-rich SiOCN

HCDO+TCDMDS+TEB→C-rich SiBOCN

HMDSO+TCDMDS+NH₃→C-rich SiOCN

HMDSO+TCDMDS+TEA→C-rich SiOCN

HMDSO+TCDMDS+TEB→C-rich SiBOCN

HCDSN+TCDMDS+NH₃→SiCN

HCDSN+TCDMDS+TEA→C-rich SiCN

HCDSN+TCDMDS+TEB→C-rich SiBCN

Modification Example 10

Figure 4B:
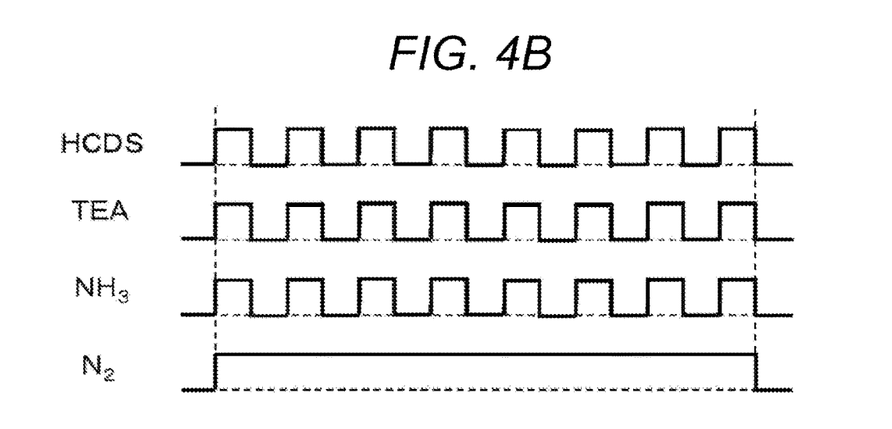
FIGS. 4B and 4C are diagrams illustrating a modification example of a film-forming sequence according to an embodiment of this present disclosure.
Figure 4C:
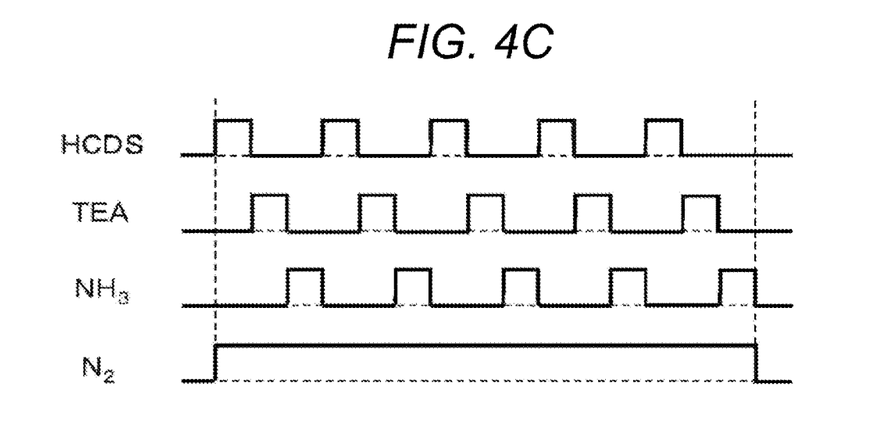

When a plurality of types of sources are supplied to the wafer 200, at least one source of them may be intermittently supplied. For example, as in the film-forming sequence illustrated in FIG. 4B, all of an HCDS gas, a TEA gas, and an NH₃ gas may be intermittently and simultaneously supplied to the wafer 200 once or more to form a SiCN film on the wafer 200. In addition, for example, as in the film-forming sequence illustrated in FIG. 4C, all these three types of gases may be intermittently and non-simultaneously supplied to the wafer 200 to form a SiCN film on the wafer 200. That is, a SiCN film may be formed on the wafer 200 by alternately performing the supply of various types of sources to the wafer 200 without sandwiching a step of purging the inside of the process chamber 201 between them. In addition, for example, one of these three types of gases may be continuously supplied, and the other two types of gases may be supplied intermittently and simultaneously or non-simultaneously. In addition, for example, two of these three types of gases may be supplied continuously and simultaneously, and the other one type of gas may be supplied intermittently.

In the present modification example, the same effects as those of the film-forming sequence illustrated in FIG. 4A can also be obtained. In addition, according to the present modification example, the film thickness of the film formed on the wafer 200 can be controlled with high accuracy by adjusting the number of repetitions of the intermittent supply of gases. However, the film-forming sequence illustrated in FIG. 4A is preferable in that the deposition rate can be increased. Incidentally, the various gas supply sequences provided in the present modification example can be arbitrarily combined and can be applied to each of the various modification examples described above.

OTHER EMBODIMENTS

The embodiments of this present disclosure have been specifically described above. However, this present disclosure is not limited to the above-described embodiments, and various modifications can be made thereto without departing from the scope of this present disclosure.

It is preferable that the recipe used in the substrate processing is individually prepared according to the contents of the processing and are stored in the memory device 121c through the electric communication line or the external memory device 123. It is preferable that, when the processing is started, the CPU 121a appropriately selects a suitable recipe from the plurality of recipes stored in the memory device 121c according to the contents of the substrate processing. Therefore, films having various film types, composition ratios, film qualities, and film thicknesses can be formed with excellent reproducibility by using a single substrate processing apparatus. In addition, since the workload of an operator can be reduced, various processes can be promptly started while avoiding operation mistake.

The above-described recipe is not limited to the case of newly creating a process recipe. For example, the process recipe may be prepared by modifying an existing recipe having already been installed on the substrate processing apparatus. When the recipe is modified, the modified recipe may be installed on the substrate processing apparatus through the telecommunication line or the non-transitory computer-readable recording medium storing the corresponding recipe. In addition, the existing recipe having already been installed on the substrate processing apparatus may be directly modified by operating the I/O device 122 provided in the existing substrate processing apparatus.

In the above-described embodiments, the example of forming the film by using a batch-type substrate processing apparatus which processes a plurality of sheets of substrates at a time has been described. However, this present disclosure is not limited to the above-described embodiments. For example, this present disclosure can be suitably applied to the case of forming a film by using a single-wafer-type substrate processing apparatus which processes one substrate or several substrates at a time. In addition, in the above-described embodiments, the example of forming the film by using a substrate processing apparatus including a hot-wall-type process furnace has been described. However, this present disclosure is not limited to the above-described embodiments. For example, this present disclosure can be suitably applied to the case of forming a film by using a substrate processing apparatus including a cold-wall-type process furnace.

Figure 5A:
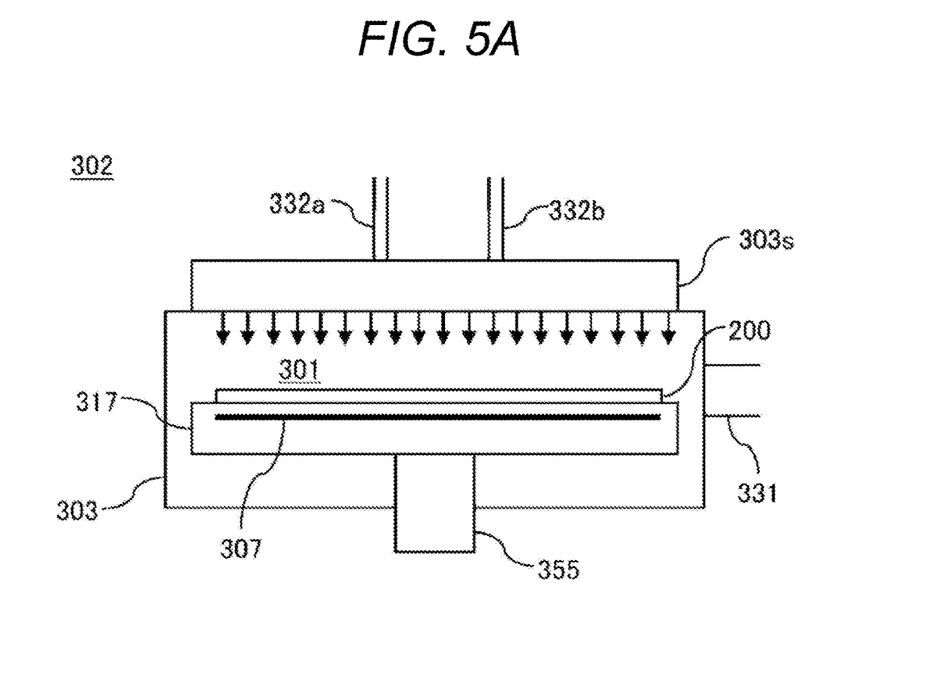
FIGS. 5A and 5B are schematic configuration diagrams of a process furnace of a substrate processing apparatus suitably used in another embodiment of this present disclosure and a longitudinal sectional view of a process furnace part.

For example, this present disclosure can also be suitably applied to the case of forming a film by using a substrate processing apparatus including a process furnace 302 illustrated in FIG. 5A. The process furnace 302 includes a process vessel 303 configured to form a process chamber 301, a shower head 303s serving as a gas supply unit configured to supply a gas into the process chamber 301 in a shower shape, a support table 317 configured to support one sheet or several sheets of wafers 200 in a horizontal posture, a rotational shaft 355 configured to support the support table 317 from below, and a heater 307 provided in the support table 317. Gas supply ports 332a and 332b are connected to an inlet of the shower head 303s. The same supply systems as the various supply systems of the above-described embodiments are connected to the gas supply ports 332a and 332b. A gas dispersion plate is provided at an outlet of the shower head 303s. The shower head 303s is provided at a position opposite to (facing) the surface of the wafer 200 loaded into the process chamber 301. An exhaust port 331 configured to exhaust the inside of the process chamber 301 is provided in the process vessel 303. The same exhaust system as the exhaust system of the above-described embodiment is connected to the exhaust port 331.

Figure 5B:
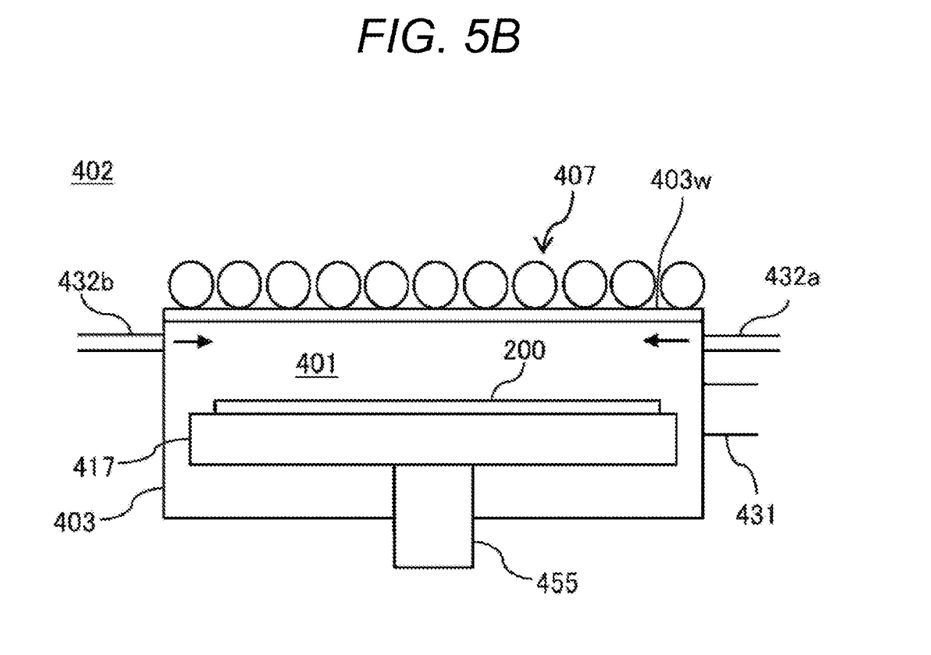

In addition, for example, this present disclosure can also be suitably applied to the case of forming a film by using a substrate processing apparatus including a process furnace 402 illustrated in FIG. 5B. The process furnace 402 includes a process vessel 403 configured to form a process chamber 401, a support table 417 configured to support one sheet or several sheets of wafers 200 in a horizontal posture, a rotational shaft 455 configured to support the support table 417 from below, a lamp heater 407 configured to emit light toward the wafers 200 in the process vessel 403, and a quartz window 403w configured to transmit the light of the lamp heater 407. Gas supply ports 432a and 432b are connected to the process vessel 403. The same supply systems as the various supply systems of the above-described embodiments are connected to the gas supply ports 432a and 432b. The gas supply ports 432a and 432b are respectively provided at sides of the edge of the wafer 200 loaded into the process chamber 401. An exhaust port 431 configured to exhaust the inside of the process chamber 401 is provided in the process vessel 403. The same exhaust system as the exhaust system of the above-described embodiment is connected to the exhaust port 431.

Even when these substrate processing apparatuses are used, the film-forming process can be performed under the same process procedures and process conditions as those of the above-described embodiments and modification examples, and the same effects as those of the above-described embodiments or modification examples can be obtained.

In the above-described embodiment or modification example, the example of forming the film containing Si as a main element on the substrate has been described, but this present disclosure is not limited to such an embodiment. That is, this present disclosure can be suitably applied to the case of forming a film containing a semimetal element, such as germanium (Ge), B, or the like, in addition to Si, as a main element on a substrate. In addition, this present disclosure can be suitably applied to the case of forming a film containing a metal element, such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al), or the like, as a main element on a substrate.

In addition, the above-described embodiments or modification examples can be used in combination as appropriate. The process procedures and process conditions at this time can be the same as the process procedures and process conditions of the above-described embodiment, for example.

Preferred Aspects of this Present Disclosure

Hereinafter, preferred aspects of this present disclosure will be supplementarily described.
(Supplementary Note 1)
According to one aspect of this present disclosure, there is provided a method of manufacturing a semiconductor device or a substrate processing method, including forming a film on a substrate by overlapping the following during at least a certain period:
(a) supplying a first source to a substrate, the first source including at least one of an inorganic source containing a specific element (main element) and a halogen element and an organic source containing the specific element and the halogen element;
(b) supplying a second source to the substrate, the second source including at least one of amine, organic hydrazine, and hydrogen nitride; and
(c) supplying a third source to the substrate, the third source including at least one of amine, organic hydrazine, hydrogen nitride, and organic borane.
(Supplementary Note 2)
Preferably, in the method according to Supplementary Note 1, the second source includes amine, and the third source includes hydrogen nitride.
(Supplementary Note 3)
In addition, preferably, the method according to Supplementary Note 2, further includes supplying a fourth source including organic borane to the substrate.
(Supplementary Note 4)
In addition, preferably, in the method according to Supplementary Note 1, the second source includes first amine, and the third source includes second amine having a different chemical structure from that of the first amine.
(Supplementary Note 5)
In addition, preferably, in the method according to Supplementary Note 4, a degree of substitution of one of the first amine and the second amine is smaller than a degree of substitution of the other.
(Supplementary Note 6)
In addition, preferably, the method according to Supplementary Note 4, further includes supplying a fourth source including hydrogen nitride to the substrate.
(Supplementary Note 7)
In addition, preferably, the method according to Supplementary Note 4, further includes supplying a fourth source including organic borane to the substrate.
(Supplementary Note 8)
In addition, preferably, in the method according to Supplementary Note 1, the second source includes amine, and the third source includes organic borane.

(Supplementary Note 9)

In addition, preferably, in the method according to Supplementary Note 1, the second source includes hydrogen nitride, and the third source includes organic borane.

(Supplementary Note 10)

In addition, preferably, in the method according to Supplementary Note 1, the first source contains a chemical bond of the specific element and nitrogen.

(Supplementary Note 11)

In addition, preferably, in the method according to Supplementary Note 1, the first source contains a chemical bond of the specific element and oxygen.

(Supplementary Note 12)

In addition, preferably, in the method according to Supplementary Note 1, the first source includes both the inorganic source and the organic source.

(Supplementary Note 13)

According to another aspect of this present disclosure, there is provided a method of manufacturing a semiconductor device or a substrate processing method, including forming a film on a substrate by overlapping the following during at least a certain period:

(a) supplying a first source to a substrate, the first source being an inorganic source containing a specific element (main element) and a halogen element;

(b) supplying a second source to the substrate, the second source being an organic source containing the specific element and the halogen element; and (c) supplying a third source to the substrate, the third source including at least one of amine, organic hydrazine, hydrogen nitride, and organic borane.

(Supplementary Note 14)

Preferably, the method according to Supplementary Note 13 further includes supplying a fourth source to the substrate, the fourth source including at least one of amine, organic hydrazine, hydrogen nitride, and organic borane.

(Supplementary Note 15)

In addition, preferably, in the method according to Supplementary Note 13 or 14, at least one of the first source and the second source contains a chemical bond of the specific element and nitrogen.

(Supplementary Note 16)

In addition, preferably, in the method according to Supplementary Note 13 or 14, at least one of the first source and the second source contains a chemical bond of the specific element and oxygen.

(Supplementary Note 17)

According to another aspect of this present disclosure, there is provided a substrate processing apparatus including:

a process chamber configured to accommodate a substrate;

a first supply system configured to supply a first source to a substrate in the process chamber, the first source including at least one of an inorganic source containing a specific element and a halogen element and an organic source containing the specific element and the halogen element;

a second supply system configured to supply a second source to the substrate in the process chamber, the second source including at least one of amine, organic hydrazine, and hydrogen nitride;

a third supply system configured to supply a third source to the substrate in the process chamber, the third source including at least one of amine, organic hydrazine, hydrogen nitride, and organic borane; and a controller configured to control the first supply system, the second supply system, and the third system so as to perform the processing of Supplementary Note 1.

(Supplementary Note 18)

According to another aspect of this present disclosure, there is provided a program that causes a substrate processing apparatus to perform the processing of Supplementary Note 1 by a computer, or a non-transitory computer-readable recording medium storing the program.

What is claimed is:

1. A method of manufacturing a semiconductor device comprising forming a film on a substrate by overlapping the following during at least a certain period:

(a) supplying a first source to the substrate, the first source including at least one of an inorganic source containing a specific element and a halogen element and an organic source containing the specific element and the halogen element;

(b) supplying a second source to the substrate, the second source including at least one of amine, organic hydrazine, and hydrogen nitride; and (c) supplying a third source to the substrate, the third source including at least one of amine, organic hydrazine, hydrogen nitride, and organic borane, wherein the second source includes amine, and the third source includes hydrogen nitride, and the method further comprising supplying a fourth source including organic borane to the substrate.

2. A method of manufacturing a semiconductor device comprising forming a film on a substrate by overlapping the following during at least a certain period:

(a) supplying a first source to the substrate, the first source including at least one of an inorganic source containing a specific element and a halogen element and an organic source containing the specific element and the halogen element;

(b) supplying a second source to the substrate, the second source including at least one of amine, organic hydrazine, and hydrogen nitride; and (c) supplying a third source to the substrate, the third source including at least one of amine, organic hydrazine, hydrogen nitride, and organic borane, wherein the second source includes first amine, and the third source includes second amine having a different chemical structure from that of the first amine.

3. The method according to claim 2, wherein a degree of substitution of one of the first amine and the second amine is smaller than a degree of substitution of the other.

4. The method according to claim 2, further comprising supplying a fourth source including hydrogen nitride to the substrate.

5. The method according to claim 2, further comprising supplying a fourth source including organic borane to the substrate.

6. A method of manufacturing a semiconductor device comprising forming a film on a substrate by overlapping the following during at least a certain period:

(a) supplying a first source to the substrate, the first source including at least one of an inorganic source containing a specific element and a halogen element and an organic source containing the specific element and the halogen element;

(b) supplying a second source to the substrate, the second source including at least one of amine, organic hydrazine, and hydrogen nitride; and (c) supplying a third source to the substrate, the third source including at least one of amine, organic hydrazine, hydrogen nitride, and organic borane, wherein the second source includes amine or hydrogen nitride, and the third source includes organic borane.

7. A method of manufacturing a semiconductor device comprising forming a film on a substrate by overlapping the following during at least a certain period:
- (a) supplying a first source to the substrate, the first source including at least one of an inorganic source containing a specific element and a halogen element and an organic source containing the specific element and the halogen element;
- (b) supplying a second source to the substrate, the second source including at least one of amine, organic hydrazine, and hydrogen nitride; and
- (c) supplying a third source to the substrate, the third source including at least one of amine, organic hydrazine, hydrogen nitride, and organic borane, wherein the first source contains a chemical bond of the specific element and nitrogen, the first source contains a chemical bond of the specific element and oxygen, or the first source includes both of the inorganic source and the organic source.

8. A substrate processing apparatus comprising:
- a process chamber configured to accommodate a substrate;
- a first supply system configured to supply a first source to the substrate in the process chamber, the first source including at least one of an inorganic source containing a specific element and a halogen element and an organic source containing the specific element and the halogen element;
- a second supply system configured to supply a second source to the substrate in the process chamber, the second source including at least one of amine, organic hydrazine, and hydrogen nitride;
- a third supply system configured to supply a third source to the substrate in the process chamber, the third source including at least one of amine, organic hydrazine, hydrogen nitride, and organic borane; and
- a controller configured to control the first supply system, the second supply system, and the third system such that a film is formed on the substrate by overlapping the following during at least a certain period: (a) supplying the first source to the substrate in the process chamber, (b) supplying the second source to the substrate in the process chamber, and (c) supplying the third source to the substrate in the process chamber, wherein the second source includes first amine, and the third source includes second amine having a different chemical structure from that of the first amine.

9. A non-transitory computer-readable recording medium storing a program that causes a substrate processing apparatus to perform a process, in a process chamber of the substrate processing apparatus by a computer, the process comprising forming a film on a substrate by overlapping the following during at least a certain period:
- (a) supplying a first source to the substrate, the first source including at least one of an inorganic source containing a specific element and a halogen element and an organic source containing the specific element and the halogen element;
- (b) supplying a second source to the substrate, the second source including at least one of amine, organic hydrazine, and hydrogen nitride; and
- (c) supplying a third source to the substrate, the third source including at least one of amine, organic hydrazine, hydrogen nitride, and organic borane, wherein the second source includes first amine, and the third source includes second amine having a different chemical structure from that of the first amine.

* * * * *